United States Patent [19]
Matsushita et al.

[11] Patent Number: 5,459,335
[45] Date of Patent: Oct. 17, 1995

[54] SEMICONDUCTOR SUBSTRATE HAVING A THIN FILM SEMICONDUCTOR LAYER BONDED ON A SUPPORT SUBSTRATE THROUGH AN ADHESIVE LAYER

[75] Inventors: Katsuki Matsushita; Shigeru Senbonmatsu; Tsuneo Yamazaki; Tadao Iwaki; Ryuichi Takano, all of Tokyo, Japan

[73] Assignee: Seiko Instruments Inc., Japan

[21] Appl. No.: 106,408

[22] Filed: Aug. 13, 1993

[30] Foreign Application Priority Data

Aug. 26, 1992 [JP] Japan .................. 4-227645

[51] Int. Cl.⁶ .................. H01L 23/14; H01L 23/15; G02F 1/136
[52] U.S. Cl. .................. 257/59; 359/74; 359/79; 257/72; 257/506
[58] Field of Search .................. 257/782, 783, 257/347, 506, 507, 680, 99, 59, 72; 359/74–79, 81

[56] References Cited

U.S. PATENT DOCUMENTS

| | | | |
|---|---|---|---|
| 4,888,364 | 12/1989 | Lai et al. | 257/791 |
| 5,034,801 | 7/1991 | Fischer | 257/788 |
| 5,121,190 | 6/1992 | Hsiao et al. | 257/778 |

FOREIGN PATENT DOCUMENTS 0504669  9/1992  European Pat. Off. ............ 257/750

*Primary Examiner*—William Mintel
*Assistant Examiner*—Peter Toby Brown
*Attorney, Agent, or Firm*—Adams & Wilks

[57] ABSTRACT

A thin film semiconductor substrate for a display device includes a thin film semiconductor circuit layer formed on a single crystal semiconductor substrate and a support substrate formed over the thin film semiconductor circuit layer. An adhesive layer made of a fluorine-containing epoxy family adhesive is provided between the insulating layer and the support substrate. When the single crystal semiconductor substrate is removed, the yield rate in production of the thin film semiconductor substrate is greatly improved.

18 Claims, 6 Drawing Sheets

SEMICONDUCTOR SUBSTRATE HAVING A THIN FILM SEMICONDUCTOR LAYER BONDED ON A SUPPORT SUBSTRATE THROUGH AN ADHESIVE LAYER

BACKGROUND OF THE INVENTION

The present invention relates to a thin film semiconductor substrate for a display device and its method for manufacturing incorporated in an active matrix-type liquid crystal display device used mainly for a direct viewing type display apparatus or a projection-type display apparatus.

A conventional prior art method for manufacturing a thin film semiconductor substrate to be incorporated in the active matrix-type liquid crystal display device is composed of the following processes:

(A) A process of making a single crystal semiconductor layer formed on a single crystal semiconductor substrate containing an insulating oxide film between them into a thin film semiconductor circuit layer by means of high resolution semiconductor processing;

(B) A process of sticking together the thin film semiconductor circuit layer and a support substrate with an adhesive layer between them; and (C) A process of removing the single crystal semiconductor substrate by means of grinding or etching while leaving the oxide film layer of the single crystal semiconductor substrate and the thin film semiconductor circuit layer.

However, the above-mentioned conventional manufacturing method has the following problems.

In the process of removing a single crystal semiconductor substrate by means of the former manufacturing method, first, a thickness of 625 μm is shaved off to about 125 μm by means of grinding and next, the rest of it is removed by means of anisotropic etching while using the oxide layer as a stopper layer. In this case there is a problem such that before the etching is finished a thin film semiconductor circuit layer is destroyed by stripping off the thin film semiconductor circuit layer from its circumference part, since the etching agent penetrates into the boundary face between the support substrate and the adhesive layer from the circumference and erodes the adhesive layer as the etching proceeds and the thickness of the single crystal semiconductor substrate becomes reduced. Furthermore, where the difference in levels of a pattern of a thin film semiconductor circuit layer is large, there is also a problem that according to the progress of the etching and as the thickness of the single crystal semiconductor substrate becomes reduced, the stress concentrated on the level difference part of the pattern, which has been suppressed by the thickness of the single crystal semiconductor substrate until that time, becomes released, and exfoliation of the thin film semiconductor circuit layer begins at this point.

An object of the present invention is to solve the above-mentioned prior art problems and to provide a new method for manufacturing a thin film semiconductor substrate by removing a single crystal semiconductor substrate while leaving an oxide film layer and a thin film semiconductor circuit layer after sticking together a support substrate and the thin film semiconductor circuit layer formed on the single crystal semiconductor substrate and containing the oxide layer therebetween.

SUMMARY OF THE INVENTION

In a first embodiment, the present invention is characterized in that, after sticking together the thin film semiconductor circuit layer and the support substrate which are formed so as to contain therebetween the insulating oxide film layer, in a manufacturing method of a thin film semiconductor substrate by removing the single crystal semiconductor substrate while leaving the oxide film layer and the thin film semiconductor circuit layer, said thin film semiconductor circuit layer is stuck with said support substrate by means of a fluorine containing epoxy family resin adhesive. In another emobodiment, the invention is characterized in that, a thin film semiconductor circuit layer and a support substrate are stuck together by means of a fluorine containing epoxy family adhesive after forming a smoothing layer having silicon dioxide as the main ingredient on the thin film semiconductor circuit layer in a method for manufacturing a thin film semiconductor device by removing a single crystal semiconductor substrate while leaving an oxide film layer and a thin film semiconductor circuit layer after sticking together a support substrate and the thin film semiconductor layer formed on the single crystal semiconductor circuit substrate in a way to contain the oxide film layer therebetween.

In the thin film semiconductor device according to the present invention as described above, since a thin film semiconductor circuit layer and a support substrate formed on a single crystal semiconductor substrate containing an insulating oxide film layer therebetween are stuck together by means of a fluorine containing epoxy family adhesive of high chemical resistivity, subsequent etching off of the single crystal semiconductor substrate by using the oxide film layer as a stopper layer does not erode the adhesive layer. As a result, the etching process can be finished without exfoliation or destruction of the thin film semiconductor circuit layer from its circumference. Further, after the formation of a smoothing layer, having silicon dioxide as the main ingredient, on the thin film semiconductor circuit layer, formed on a single crystal semiconductor substrate with an oxide film layer between the circuit layer and the substrate, a support substrate is stuck on the smoothing layer by means of a fluorine containing epoxy family adhesive, thereafter, when etching off the single crystal semiconductor substrate by using the oxide film layer as a stopper, a level difference part on the thin film semiconductor circuit layer is smoothed by the smoothing layer and the stress concentrated on the level difference part is dispersed. As a result, even when the etching proceeds and the thickness of the single crystal semiconductor substrate becomes reduced, the thin film semiconductor circuit layer can be protected from exfoliation.

DETAILED DESCRIPTION OF THE PREFERRED EMBODIMENTS

Figure 1A:
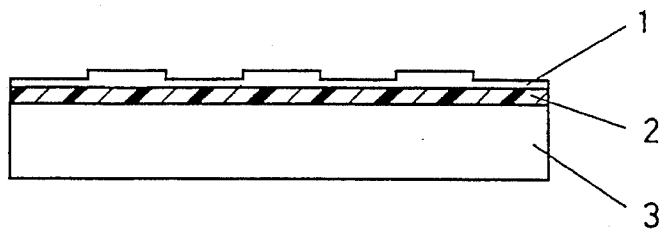
FIGS. 1(A) to 1(E) show cross-sectional views of a first embodiment of a method for manufacturing a thin film semiconductor device according to the present invention.
Figure 1B:
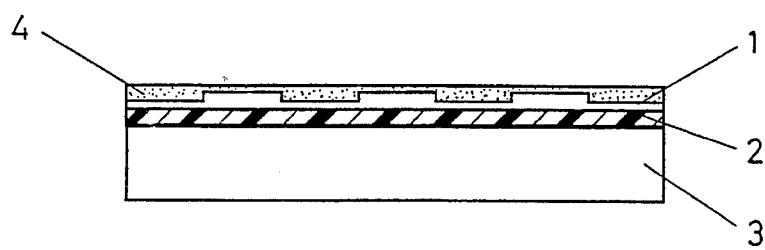
Figure 1C:
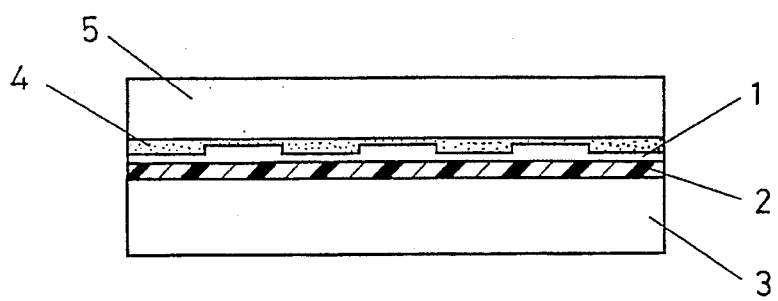
Figure 1D:
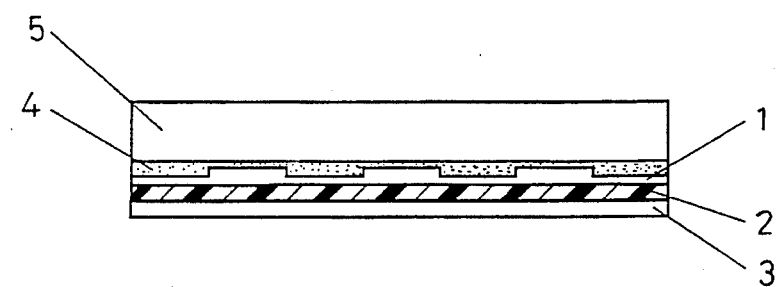

Embodiments of the invention are described below, referring to the drawings.

FIG. 1(A) to (E) show cross-sectional views of a first embodiment of a thin film semiconductor device manufacturing method of the present invention.

First, as shown in FIG. 1(A), for example, an insulating oxide film layer 2 made of silicon oxide (an inorganic substance), is formed on a single crystal semiconductor substrate 3 made of silicon. A thin film semiconductor circuit layer 1 is then formed with an integrated circuit on the silicon oxide layer by means of high resolution semiconductor processing.

Next, as shown in FIG. 1 (B), an adhesive layer is formed with a fluorine containing epoxy family adhesive 4. As shown in FIG. 1 (C), the thin film semiconductor circuit layer 1 and a support substrate 5 are then stuck together with the fluorine containing epoxy family adhesive 4, and then the adhesive is set. The support substrate 5 is made of a hardened insulating material such as glass, quartz or the like. In this case, either of an ultraviolet rays setting type, thermosetting type and 2-liquid setting type may be used as a setting mechanism for the fluorine containing epoxy family adhesive 4 to stick together the thin film semiconductor circuit layer 1 and the support substrate 5.

FIG. 1 (D) shows a state in the course of removing the single crystal semiconductor substrate 3 while leaving the oxide layer 2 and the thin film semiconductor circuit layer 1. As a method for removing the single crystal semiconductor substrate 3, methods such as grinding, etching or the like are suitable. In the embodiment, about 80% of the original thickness of the single crystal semiconductor substrate 3 was removed by grinding.

Figure 1E:
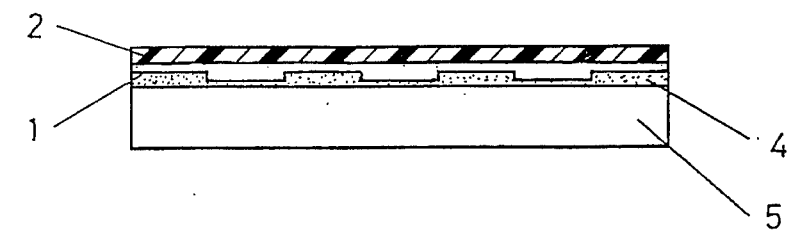
Figure 2A:
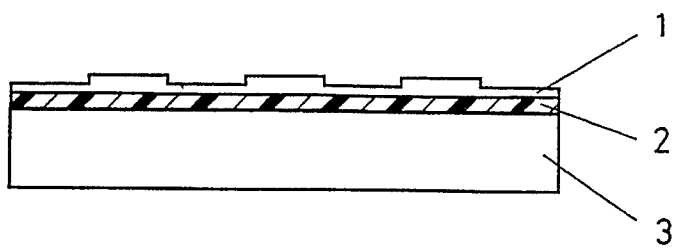
FIGS. 2(A) to 2(F) show a cross-sectional view of a second embodiment of a method for manufacturing a thin film semiconductor device according to the present invention.
Figure 2B:
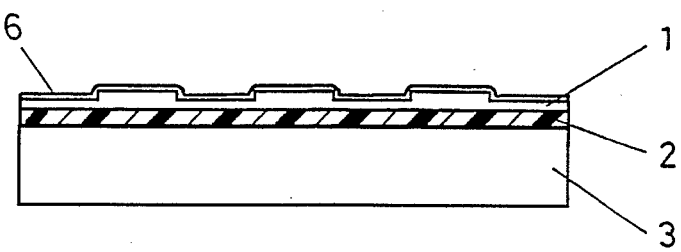
Figure 2C:
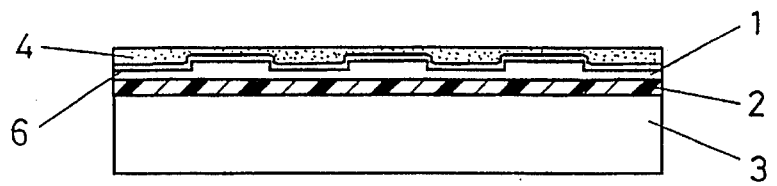
Figure 2D:
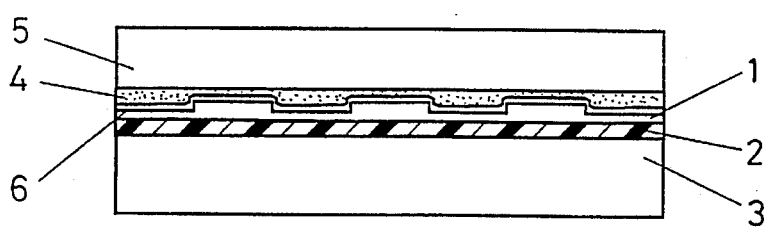
Figure 2E:
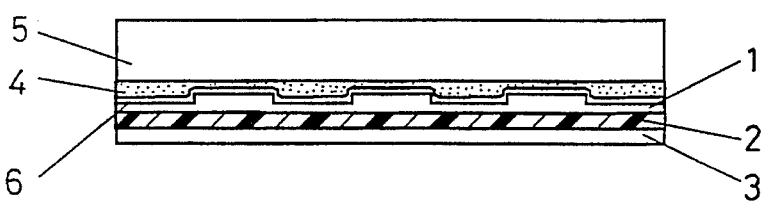
Figure 2F:
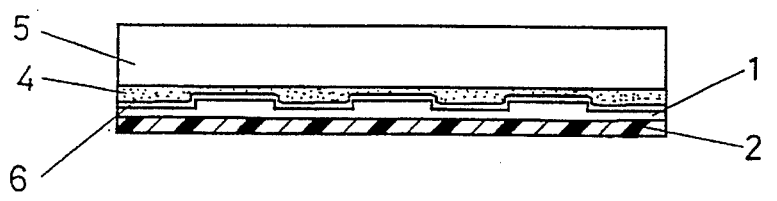

FIG. 1(E) shows a state in which the rest of the single crystal semiconductor substrate 3 in FIG. 1 (D) has been removed. Etching is used as a removing method and the oxide film layer 2 can be used as a stopper layer for the etching.

In the thin film semiconductor substrate manufactured as described above, the etching could be finished without exfoliation of the single crystal semiconductor substrate 3 from its circumference, since the fluorine containing epoxy family adhesive 4 is not eroded by the etching agent even when the etching proceeds to reduce the thickness of the single crystal semiconductor substrate.

FIGS. 2 (A) to (F) show cross-sectional views of a second embodiment of a thin film semiconductor device manufacturing method of the invention.

First, as shown in FIG. 2 (A), for example, an oxide film layer 2 made of a silicon oxide film is formed on a single crystal semiconductor substrate 3 made of silicon, on which is formed a thin film semiconductor circuit layer 1 being formed with an integrated circuit on a silicon layer by means of high resolution semiconductor processing.

Next, as shown in FIG. 2 (B), the rough surface of the thin film semiconductor circuit layer 1 is smoothed by forming a smoothing layer 6 having silicon dioxide as the main ingredient on the thin film semiconductor circuit layer 1 by means of a spin-coating method or the like. Next, as shown in FIG. 2 (C), an adhesive layer is formed by means of a fluorine containing epoxy family adhesive 4.

As shown in FIG. 2 (D), the thin film semiconductor circuit layer 1 and a support layer 5 are stuck together through the smoothing layer 6 by means of the fluorine containing epoxy family adhesive 4, and thereafter the adhesive is set. The support substrate 5 is made of a hardened insulating material such as glass, quartz or the like. In this case, either of an ultraviolet rays setting type, thermosetting type and 2-liquid setting type may be used as a setting mechanism for the fluorine containing epoxy family adhesive 4 to stick together the thin film semiconductor circuit layer 1 and the support substrate 5.

FIG. 2 (E) shows a state in the course of removing the single crystal semiconductor substrate 3 while leaving the oxide layer 2 and the thin film semiconductor circuit layer 1. Grinding, etching or the like are suitable as methods for removing the single crystal semiconductor substrate 3. In the present embodiment, about 80% of the original thickness of the single crystal semiconductor substrate 3 was removed by grinding.

FIG. 2 (F) shows a state in which the rest of the single crystal semiconductor substrate 3 in FIG. 2 (E) has been removed. Etching is used as a removing method, and at this time the oxide film layer 2 can be used as a stopper layer for the etching.

In the thin film semiconductor substrate manufactured as described above, the etching could be finished without exfoliation of the single crystal semiconductor substrate 3, since the stress concentrated on the level difference part of the surface of the thin film semiconductor circuit layer 1 is dispersed by smoothing the rough surface by means of a smoothing layer 6 even when the etching proceeds to reduce the thickness of the single crystal semiconductor substrate.

Figure 3:
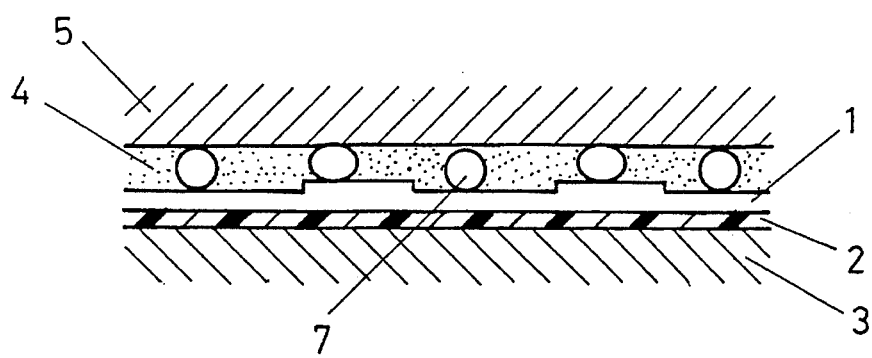
FIG. 3 is an enlargement of a cross-sectional view of the fluorine containing epoxy adhesive of the invention.

FIG. 3 is a cross-sectional view of a thin film semiconductor substrate in which the thickness of the fluorine containing epoxy family adhesive has been controlled in the first or second embodiment of the invention. Thickness of the adhesive can be controlled in a uniform manner either by applying the fluorine containing epoxy family adhesive 4, after mixing transparent plastic particles 7 to it, to the thin film semiconductor circuit layer 1 or by applying the fluorine containing epoxy family adhesive 4 to the thin film semiconductor circuit layer 1 after spreading the transparent plastic particles 7 in specified density on the circuit layer 1 and then sticking the support substrate 5 on it. The transparent particles 7 have a specified size which is effective to establish a uniform thickness of the adhesive layer 4. For example, the diameter of the plastic particle may be generally equal to the thickness of the adhesive layer 4 as shown in FIG. 3. Since the single crystal semiconductor substrate 3 can be uniformly removed by grinding or etching by controlling in constant thickness the adhesive in this manner, the thin film semiconductor circuit layer 1 can be more reliably protected from exfoliation.

Figure 4:
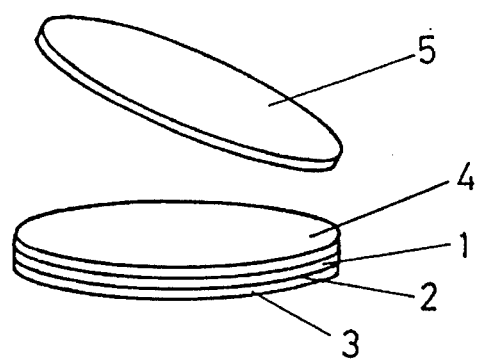
FIG. 4 is an explanatory figure showing one method for making a support substrate and a thin film semiconductor circuit layer adhere to each other.

FIG. 4 is an explanatory figure showing one of the methods for sticking together a support substrate 5 and a thin film semiconductor circuit layer 1 in the first or second embodiment of the invention. The adhering process is completed by applying a fluorine containing epoxy family adhesive 4 to at least one of the support substrate 5 and a thin film semiconductor circuit layer 1, sticking them together face to face, and then hardening the adhesive.

Figure 5:
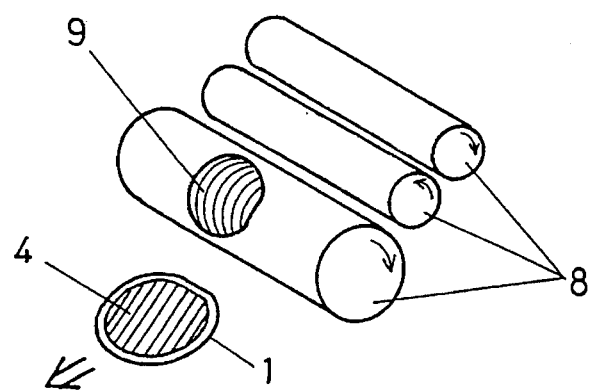
FIG. 5 is an explanatory figure showing a method for applying an adhesive to a support substrate or a thin film semiconductor circuit layer.

FIG. 5 is an explanatory figure showing one method for applying an adhesive 4 to a support substrate 5 or a thin film semiconductor circuit layer 1 in FIG. 4. A relief 9 formed in a specified shape (shape desired to apply) is stuck on a roll 8, and a fluorine containing epoxy family adhesive 4 is transferred onto the relief 9 from the roll 8. The adhesive 4 is transferred onto the thin film semiconductor circuit layer 1 in the specified pattern from the relief 9 on the roll 8 by moving the roll 8 or the thin film semiconductor circuit layer 1 relatively to each other after transferring the adhesive 4.

Figure 6:
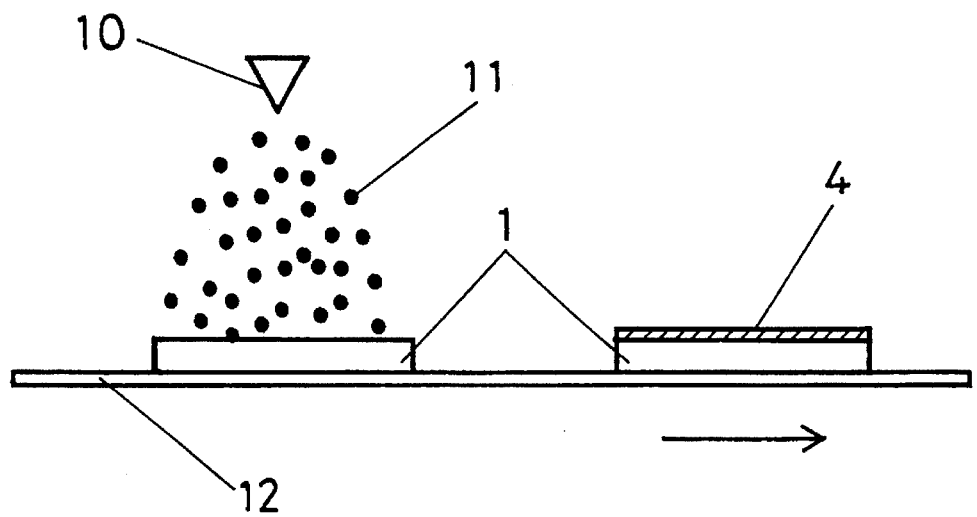
FIG. 6 is an explanatory figure showing another method for applying an adhesive to a support substrate or a thin film semiconductor circuit layer.

FIG. 6 is an explanatory figure showing another method for applying the adhesive 4 to the support substrate 5 or the thin film semiconductor circuit layer 1 in FIG. 4. The fluorine containing epoxy family adhesive 4 diluted with a solution is deposited on the support substrate 5 or the thin film semiconductor circuit layer 1 as an adhesive in a state of mist 11 by being sprayed from a nozzle 10. At this time, the support substrate 5 or the thin film semiconductor circuit layer 1 is conveyed by a conveyer belt 12 to move from left to right in the figure. In the course of conveying the support substrate 5 or the thin film semiconductor circuit layer 1 having the adhesive deposited on it from a state of mist by means of the conveyer belt 12, the solution is volatilized and only the adhesive is uniformly applied.

Figure 7:
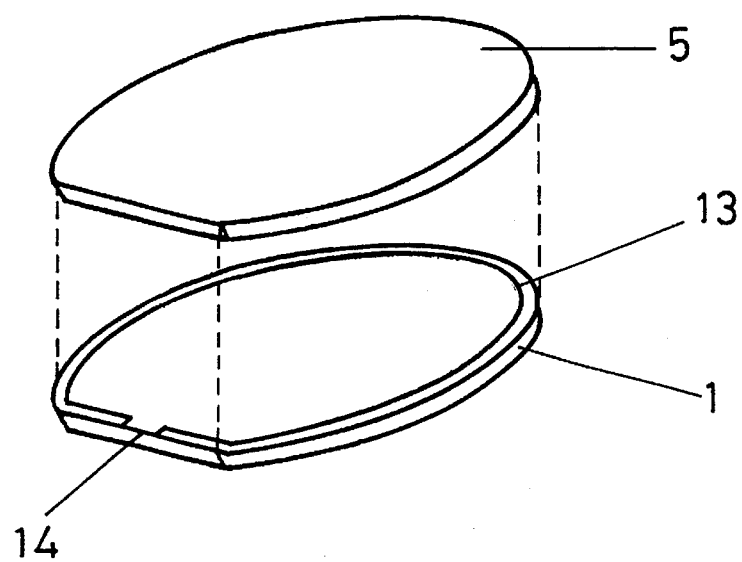
FIG. 7 is an explanatory figure showing one method for making a support substrate and a thin film semiconductor circuit layer adhere to each other.
Figure 8:
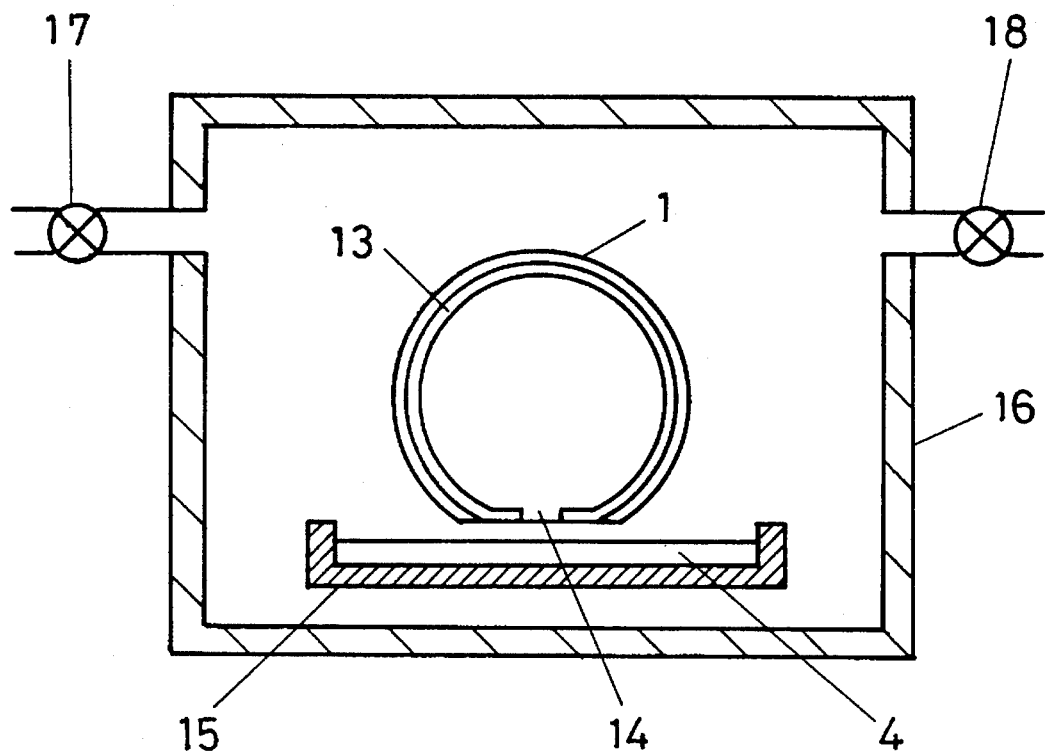
FIG. 8 is an explanatory figure showing an outline of an apparatus for injecting an adhesive into a slit.

FIG. 7 and 8 are figures explaining one method for sticking together the support substrate 5 and the thin film semiconductor circuit layer 1 in the first or second embodiment of the invention. The support substrate 5 and the thin film semiconductor circuit layer 1 are stuck together face to face after forming a sealing agent 13 in a shape of frame on the circumference of the wafer. At this time, an inlet 14 is formed in a part of the frame-shaped sealing agent. A thermosetting resin, ultraviolet rays setting resin or the like is used as the frame-shaped sealing agent 3. A slit is formed between the support substrate 5 and the thin film semiconductor circuit layer 1 by sticking them together after spreading transparent plastic particles (not shown in the figure) on one of their faces facing each other before sticking together the support substrate 5 and the thin film semiconductor circuit layer 1.

FIG. 8 is an explanatory figure showing an outline of an apparatus for injecting the adhesive into the slit. The thin film semiconductor circuit layer 1 and the support substrate 5, which have a slit formed between them by the frame-shaped sealing agent 13, are hung inside a pressure container 16 so that the inlet 14 may come downward. This container 16 is connected with an exhaust system through an exhaust valve 17 and can intake air through an exhaust valve 18. An adhesive storing container 15 containing the fluorine containing epoxy family adhesive 4 is placed at the bottom of the pressure container 16.

In the above-mentioned system, the pressure container 16, the thin film semiconductor circuit layer 1 and the support substrate 5 are, first, exhausted by opening the exhausting valve 17 and making the exhausting system operate. As a result, gas inside the slit between the thin film semiconductor circuit layer 1 and the support substrate 5 is quickly exhausted to a vacuum state. At this time, the air which has dissolved in the fluorine containing epoxy family adhesive 4 in the adhesive storing container 15 can be also exhausted. After the exhaustion has been fully made, the exhausting valve 17 is closed and the inlet 14 of the thin film semiconductor circuit layer 1 and support substrate 5 hung down is immersed in the fluorine containing epoxy family adhesive 4.

Next, when the inhaling valve 18 is opened and air or nitrogen gas flows into the pressure container, the surface of the fluorine containing epoxy family adhesive 4 is pressurized. As a result, the fluorine containing epoxy family adhesive 4 is injected into the slit between the thin film semiconductor circuit layer 1 and the support substrate 5. After the slit has been filled with the fluorine containing epoxy family adhesive 4, the thin film semiconductor circuit layer 1 and the support substrate 5 are taken out from the pressure container 15, and then the fluorine containing epoxy family adhesive 4 is cured to complete the adhering process. According to such a method, since an adhesive layer of uniform thickness having no air bubbles can be formed, a thin film semiconductor circuit layer and a support layer can be firmly stuck together.

Figure 9:
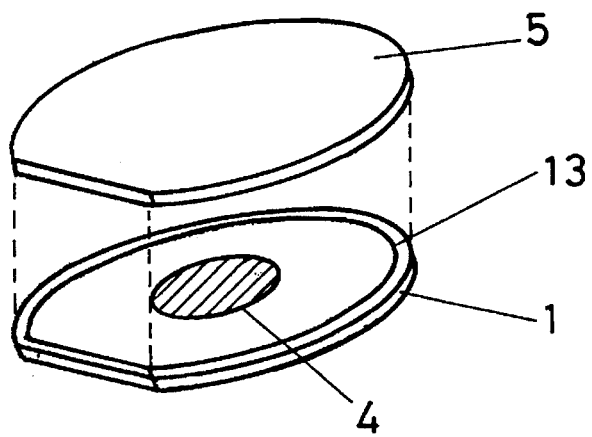
FIG. 9 is an explanatory figure showing one method for sticking together a support substrate and a thin film semiconductor circuit layer.

FIG. 9 is an explanatory figure showing one of methods for sticking together the thin film semiconductor circuit layer and the support substrate in the first or second embodiment of the invention. First, a frame-shaped sealing material 13 is formed on the support substrate 5 or the thin film semiconductor circuit layer 1. A thermosetting resin, ultraviolet rays setting resin or the like is used as the frame-shaped sealing material. Next, the fluorine containing epoxy family adhesive 4 is dropped in one time or several times near the middle of the area surrounded by the sealing material 13 on the support substrate 5 or the thin film semiconductor circuit layer 1. At this time, in order to keep the space uniform between the support substrate 5 and the thin film semiconductor circuit layer 1, the fluorine containing epoxy family adhesive 4 mixed with transparent plastic particles (not shown in the figure) is dropped, or the fluorine containing epoxy family adhesive 4 is dropped after spreading the transparent plastic particles on the support layer 5 or the thin film semiconductor circuit layer 1.

Figure 10:
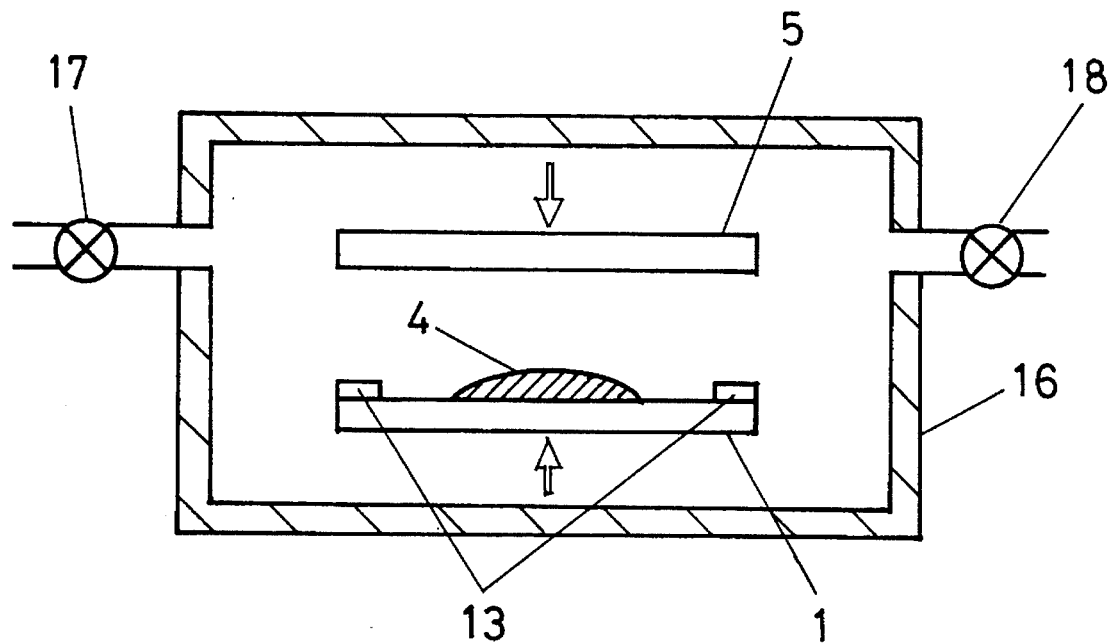
FIG. 10 is an explanatory figure showing an outline of a vacuum sticking apparatus.

FIG. 10 is a figure showing an outline of a vacuum sticking apparatus. One layer of the support substrate 5 and the thin film semiconductor circuit layer 1 which has the frame-shaped sealing material 13 formed on it and has the fluorine containing epoxy family adhesive 4 dropped on it and the other layer having no sealing material on it are disposed with their faces to be stuck together facing each other so that the former layer may be under the latter layer. In order to stick both layers together, the pressure container 16 is first exhausted by opening the exhausting valve 17 and making the exhausting system operate. At this time the air which has dissolved in the fluorine containing epoxy family adhesive 4 dropped on the thin film semiconductor circuit layer 1 or the support substrate 5 can be also exhausted. After the exhaustion is fully made, the thin film semiconductor circuit layer 1 and the support substrate 5 are stuck together. Next, after restoring the pressure inside the pressure container to the atmospheric pressure by opening the inhaling valve 18 and letting air or nitrogen gas flow in, the thin film semiconductor circuit layer 1 and the support substrate 5 are taken out, and then the adhering process is completed by curing the fluorine containing epoxy family adhesive 4 and the sealing material 13. According to a method such as this, since an adhesive layer of uniform thickness having no air bubbles can be formed, not only a thin film semiconductor circuit layer and a carrier layer can be firmly stuck together, but also the expensive fluorine containing epoxy family adhesive can be saved.

As described above, the invention has an excellent effect in that thin film semiconductor substrates can be manufactured with a high yield rate by sticking together a thin film semiconductor circuit layer and a carrier layer by means of a fluorine containing epoxy family adhesive of high chemical resistivity.

What is claimed is:

1. A semiconductor substrate for a display device, the semiconductor substrate comprising: a thin film semiconductor circuit layer formed on an insulating layer made of an inorganic substance; a support substrate formed over the thin film semiconductor layer; and an adhesive layer disposed between the thin film semiconductor circuit layer and the support substrate; wherein the adhesive layer is composed of a fluorine-contained containing epoxy family adhesive which is free of air bubbles.

2. A semiconductor substrate according to claim 1; further comprising a smoothing layer formed between the thin film semiconductor circuit layer and the adhesive layer.

3. A semi-conductor substrate according to claim 2; wherein the adhesive layer contains transparent plastic particles having a specified size effective to establish a uniform thickness of the adhesive layer.

4. A semiconductor substrate according to claim 2; including a frame-shaped sealing material formed on one of the thin film semiconductor circuit layer and the support substrate.

5. A semiconductor substrate according to claim 4; wherein the adhesive layer includes transparent plastic particles having a specified size effective to establish a uniform thickness of the adhesive layer.

6. A semiconductor substrate according to claim 1; wherein the adhesive layer contains transparent plastic particles having a specified size effective to establish a uniform thickness of the adhesive layer.

7. A semiconductor substrate according to claim 1; including a frame-shaped sealing material formed on one of the thin film semiconductor circuit layer and the support substrate.

8. A semiconductor according to claim 1; wherein the adhesive layer contains plastic particles having a specified diameter effective to establish a uniform thickness of the adhesive layer, the specified diameter of the plastic particles being generally equal to the thickness of the adhesive layer.

9. A semiconductor substrate for a display device, the semiconductor substrate comprising: a thin film semiconductor circuit layer formed on an insulating layer; a support substrate formed over the thin film semiconductor layer; and an adhesive layer interposed between the thin film semiconductor circuit layer and the support substrate, the adhesive layer being composed of a fluorine-containing epoxy family adhesive which is free of air bubbles.

10. A semiconductor substrate according to claim 9; further comprising a smoothing layer formed between the thin film semiconductor circuit layer and the adhesive layer.

11. A semiconductor substrate according to claim 10; wherein the adhesive layer contains transparent plastic particles having a specified size effective to establish a uniform thickness of the adhesive layer.

12. A semiconductor substrate according to claim 9; wherein the adhesive layer contains transparent plastic particles having a specified size effective to establish a uniform thickness of the adhesive layer.

13. A semiconductor substrate according to claim 9; including a frame-shaped sealing material formed on one of the thin film semiconductor circuit layer and the support substrate.

14. A semiconductor substrate according to claim 9; wherein the adhesive layer contains plastic particles having a specified diameter effective to establish a uniform thickness of the adhesive layer, the specified diameter of the plastic particle being generally equal to the thickness of the adhesive layer.

15. A semiconductor substrate for a display device, the semiconductor substrate comprising: a thin film semiconductor circuit layer formed on an insulating layer made of an inorganic substance; a support substrate formed over the thin film semiconductor layer; an adhesive layer interposed between the thin film semiconductor circuit layer and the support substrate, the adhesive layer being composed of a fluorine-containing epoxy family adhesive and containing transparent plastic particles having a specified size effective to establish a uniform thickness of the adhesive layer; and a smoothing layer formed between the thin film semiconductor circuit layer and the adhesive layer.

16. A semiconductor substrate for a display device, the semiconductor substrate comprising: a thin film semiconductor circuit layer formed on an insulating layer made of an inorganic substance; a support substrate formed over the thin film semiconductor layer; and an adhesive layer interposed between the thin film semiconductor circuit layer and the support substrate, the adhesive layer being composed of a fluorine-containing epoxy family adhesive and containing transparent plastic particles having a specified size effective to establish a uniform thickness of the adhesive layer.

17. A semiconductor substrate for a display device, the semiconductor substrate comprising: a thin film semiconductor circuit layer formed on an insulating layer made of an inorganic substance; a support substrate formed over the thin film semiconductor layer; and an adhesive layer interposed between the thin film semiconductor circuit layer and the support substrate, the adhesive layer being composed of a fluorine-containing epoxy family adhesive; and a frame-shaped sealing material formed on one of the thin film semiconductor circuit layer and the support substrate.

18. A semiconductor substrate for a display device, the semiconductor substrate comprising: a thin film semiconductor circuit layer formed on an insulating layer made of an inorganic substance; a support substrate formed over the thin film semiconductor layer; and an adhesive layer interposed between the thin film semiconductor circuit layer and the support substrate, the adhesive layer being composed of a fluorine-containing epoxy family adhesive and containing plastic particles having a specified diameter effective to establish a uniform thickness of the adhesive layer, the specified diameter of the plastic particles being generally equal to the thickness of the adhesive layer.

* * * * *